(12) United States Patent
Hisada et al.

(10) Patent No.: US 6,589,337 B2
(45) Date of Patent: Jul. 8, 2003

(54) METHOD OF PRODUCING SILICON CARBIDE DEVICE BY CLEANING SILICON CARBIDE SUBSTRATE WITH OXYGEN GAS

(75) Inventors: Yoshiyuki Hisada, Okazaki (JP); Shinichi Mukainakano, Nagoya (JP); Takeshi Hasegawa, Nagoya (JP); Ayahiko Ichimiya, Nagoya (JP); Tomohiro Aoyama, Nagoya (JP); Kiyoshige Kato, Hazu-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/946,140

(22) Filed: Sep. 5, 2001

(65) Prior Publication Data

US 2002/0033130 A1 Mar. 21, 2002

(30) Foreign Application Priority Data

Sep. 8, 2000 (JP) ......................................... 2000-273584

(51) Int. Cl.[7] ............................................... C30B 25/02
(52) U.S. Cl. ......................... 117/95; 117/97; 438/268; 438/273
(58) Field of Search ............................ 117/95, 97, 268; 438/273

(56) References Cited

U.S. PATENT DOCUMENTS 6,214,107 B1   4/2001   Kitabatake

FOREIGN PATENT DOCUMENTS

JP   A-2001-35838   2/2001

OTHER PUBLICATIONS

Aoyama et al., Meeting Abstracts of the Physical Society of Japan, vol. 55, Issue 1, Part 4 pp. 561–871, Mar. 22–25, 2000.

*Primary Examiner*—Felisa Hiteshew
(74) *Attorney, Agent, or Firm*—Posz & Bethards, PLC

(57) ABSTRACT

In a process of producing a SiC device, a Si layer is formed on the surface of a SiC substrate, and the Si layer is removed from the surface of the SiC substrate by supplying oxygen gas to the Si layer in a high ambient temperature and a low ambient pressure. The pressure is set at $1\times10^{-2}$ to $1\times10^{-6}$ Pa. Thus a cleaned surface of the SiC substrate, not contaminated by carbon and the like in atmospheric air, can be provided. Preferably, the oxygen pressure and temperature are set at about $10^{-6}$ Pa and 1000° C. for removing the Si layer. Thereafter, the oxygen is further supplied to raise the pressure to about $10^4$ Pa to form an oxide film on the cleaned SiC substrate. Thus, the SiC substrate is cleaned and then formed with the oxide layer in the same chamber by changing the ambient pressure but without changing the ambient temperature.

23 Claims, 3 Drawing Sheets

METHOD OF PRODUCING SILICON CARBIDE DEVICE BY CLEANING SILICON CARBIDE SUBSTRATE WITH OXYGEN GAS

CROSS REFERENCE TO RELATED APPLICATIONS

This application is based upon and incorporates herein by reference Japanese Patent Application No. 2000-273584 filed on Sep. 8, 2000.

BACKGROUND OF THE INVENTION

This invention relates to a method of producing a silicon carbide (SiC) device using a cleaned surface of a SiC substrate.

U.S. Pat. No. 6,214,107 discloses a method of cleaning a SiC substrate by etching process used in a silicon (Si) process. For example, buffered hydrofluoric acid process is used as follows. A surface of a SiC substrate is etched with a mixture solution of a hydrofluoric acid and an aqueous solution including ammonium fluoride of 40 vol.wt % (e.g., hydrofluoric acid:aqueous solution including ammonium fluoride of 40 vol.wt %=1:6).

In this method, however, carbon and the like in atmospheric air adhere to the surface of the SiC substrate while the SiC substrate is transferred. Actually, a composition on the surface of the SiC substrate obtained by this method is found to have a carbon cluster when analyzed by using X-ray photo electron spectroscopy (XPS).

SUMMARY OF THE INVENTION

The present invention has been made in view of the above problems. An object of the present invention is to prevent a cleaned surface of a Sic substrate from being contaminated by carbon and the like in atmospheric air so that a satisfactory SiC device can be produced.

According to the present invention, a SiC device is produced as follows. First, a silicon layer is formed on a surface of a Sic substrate. Then, the silicon layer is removed from the surface of the SiC substrate by supplying oxygen gas to the silicon layer in a high ambient temperature and a low oxygen pressure. The pressure is set at $1\times10^{-2}$ to $1\times10^{-6}$ Pa. Thus, contamination of the surface of the SiC substrate by carbon and the like in atmospheric air can be removed. Specifically, the silicon layer has 3×3 surface structure, and the surface of the SiC substrate is cleaned to have 1×1 surface structure.

Preferably, the oxygen pressure and temperature are set at about $10^{-6}$ Pa and 1000° C. for removing the silicon layer. Thereafter, the oxygen pressure is raised to about $10^4$ Pa to form an oxide film on the silicon carbide film.

BRIEF DESCRIPTION OF THE DRAWINGS

Other objects, features and advantages of the present invention will become more readily apparent from a better understanding of the preferred embodiments described below with reference to the following drawings. In the drawings.

DETAILED DESCRIPTION OF THE PREFERRED EMBODIMENT (First Embodiment)

Figure 1A:
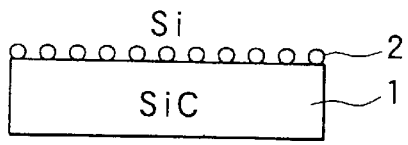
FIGS. 1A–1C are schematic views respectively showing a cleaned surface formation process of a SiC substrate according to a first embodiment of the present invention.
Figure 1B:
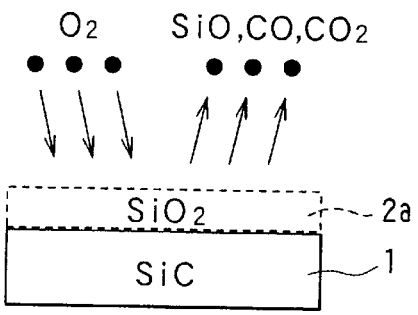
Figure 1C:
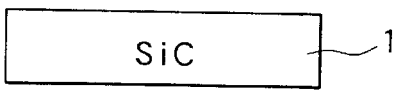

A process of cleaning a silicon carbide (SiC) substrate 1 is shown in FIGS. 1A–1C. This process is performed before a process of producing a SiC device.

First, a SiC substrate is provided. Here, although the SiC substrate 1 is composed of SiC, all of the substrate 1 is not required to be composed of SiC. It is allowed to be composed of SiC around its surface and of another material at its backing. This SiC may have any one of crystalline structure 6H, 4H, 3C or 15R. Although the SiC substrate 1 is not required to have an off angle, the SiC substrate 1 may have an off angle larger than 0 degree and smaller than 8 degrees.

As a pretreatment for the surface of the SiC substrate 1, foreign matters such as an organic matter and an oxide film is removed by ultrasonic cleaning using acetone, 49%-hydrofluoric-acid process and rinse in deionized water. Thereafter, the SiC substrate 1 is disposed in a ultra high vacuum chamber, and a Si layer 2 having a thickness of about 5 nanometers (nm) is formed on the surface of the SiC substrate 1 by vapor deposition and the like in an ambient pressure $1\times10^{-2}$ to $1\times10^{-6}$ pascal (Pa), preferably $1\times10^{-2}$ Pa, as shown in FIG. 1A.

Then, a temperature in the ultra high vacuum chamber is increased to 500 to 1100° C., preferably 1000° C., so that a most part of the Si layer 2 formed on the SiC substrate 1 is vaporized, and Si atoms of two or three atomic layers remains on the SiC substrate 1. The remaining Si layer has such structure that Si atoms are arranged in a periodicity three times as large as that of the SiC substrate. This structure can be found as 3×3 structure by diffraction patterns of reflection high-energy electron diffraction (RHEED) on a surface of the SiC substrate 1. When the SiC substrate 1 is cooled to a room temperature, this 3×3 structure can be more surely found in the RHEED pattern.

Then, the ambient pressure is set to $1\times10^{-2}$ Pa ($1\times10^{-4}$ Torr) in the above temperature, and oxygen gas is supplied into the ultra high vacuum chamber. At this time, an oxygen exposure amount onto the surface of the SiC substrate 1 is set at 1 to $10^2$ Pa·sec, preferably at 10 Pa·sec, so that oxygen is absorbed onto the surface of the SiC substrate 1. If the temperature in the ultra high vacuum chamber becomes lower due to the oxygen gas supply, a silicon oxide film 2a indicated by a broken line in FIG. 1B is formed on the surface of the SiC substrate 1. Therefore, the above temperature is maintained at the time of supplying oxygen gas.

According to this method, as shown in FIG. 1B, Si atoms and C atoms in the remaining Si layer having the 3×3 structure and the SiC substrate 1 react with oxygen (O) atoms in the oxygen gas to be removed as SiO gas, CO gas and $CO_2$ gas. As a result, the surface of the SiC substrate 1 has 1×1 structure in which only Si atoms and C atoms are periodically arranged. As shown in FIG. 1C, the cleaned surface of the SiC substrate 1, which is not contaminated by carbon and the like in atmospheric air, can be obtained in such a manner.

The ambient pressure of $1\times10^{-2}$ Pa is lower than the saturation vapor pressure at 500° C. Therefore, the oxide film is not formed on the surface of the SiC substrate 1 at the temperature. Thereby, a substance reacted with oxygen is not formed on the surface of the SiC substrate 1, that is, the surface of the SiC substrate 1 is cleaned.

When the ambient temperature is set at 1000° C., the saturated vapor pressure can be further increased, thereby ensuring the oxide vaporization so that the reacted substance, that is, the oxide film 2a does not remain on the surface of the SiC substrate 1.

A device such as a metal oxide semiconductor field effect transistor (MOS FET) can be formed using the surface of the SiC substrate 1 cleaned as above, thereby producing a SiC device having satisfactory device characteristics such as film characteristics of a gate oxide film provided on a MOS FET.

(Experimental results)

As a pretreatment for the surface of the SiC substrate 1, the surface is cleaned in acetone by an ultrasonic cleaner for five minutes, dipped into 49%-hydrofluoric-acid for five minutes and rinsed in deionized water for ten minutes. Here, the SiC substrate 1 has a Si-terminated SiC (0001) surface in the crystalline structure of 6H, which does not have an off angle. Thereafter, the SiC substrate 1 is set up in a ultra high vacuum chamber, and the Si layer 2 having a thickness of about 5 nm is formed on the surface of the SiC substrate 1 by vapor deposition in an ambient pressure of $1\times10^{-8}$ Pa ($1\times10^{-10}$ Torr).

Figure 2:
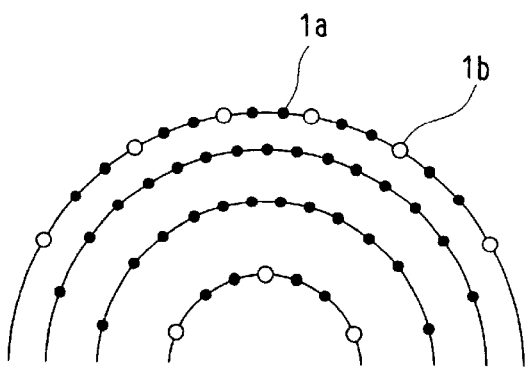
FIG. 2 is a schematic view showing a RHEED pattern (3×3 structure) for a surface of the SiC substrate on which a Si layer is formed.
Figure 3:
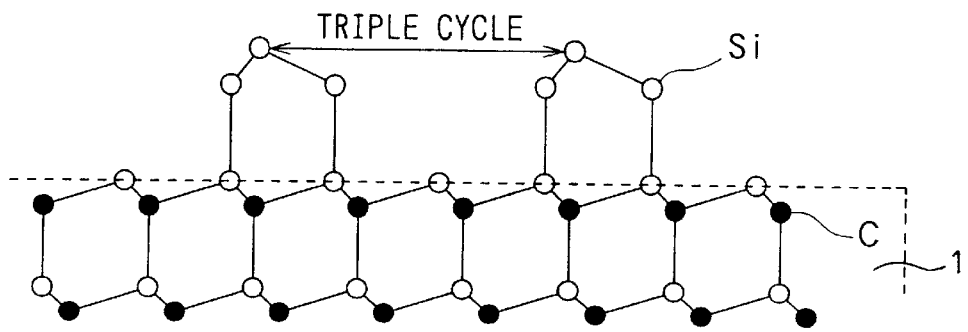
FIG. 3 is a cross-sectional view showing the 3×3 structure determined by a RHEED locking curve.

Then, a temperature in the ultra high vacuum chamber is raised to 1000° C., so that a most part of the Si layer 2 formed on the SiC substrate 1 is vaporized, and Si atoms of two or three atomic layers remain on the SiC substrate 1. A RHEED pattern investigated with respect to the surface of the SiC substrate 1 is found to show 3×3 periodicity in which sub-spots 1a are arranged between main spots 1b as shown in FIG. 2. Here, cross-sectional atomic arrangement of the 3×3 structure, determined by a RHEED locking curve, is shown in FIG. 3.

Figure 4:
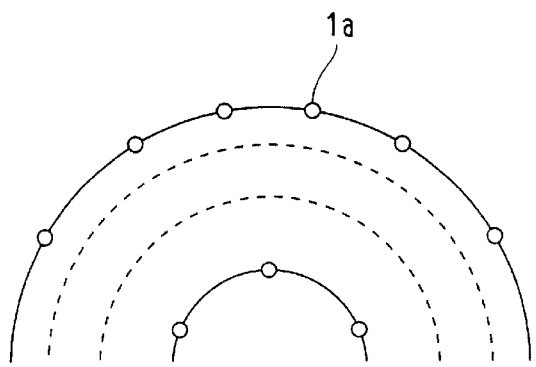
FIG. 4 is a schematic view showing a RHEED pattern (1×1 structure) for a surface of the SiC substrate from which a Si layer is removed.

At this temperature 1000° C., oxygen gas supply amount is adjusted so that an oxygen exposure amount onto the surface of the SiC substrate 1 is set at 10 Pa•sec. Thus, an ambient pressure is set at $1\times10^{-2}$ Pa ($1\times10^{-4}$ Torr). At this time, the RHEED pattern investigated is found to show clear 1×1 periodicity in which only the main spots are observed but the sub-spots are not observed as shown in FIG. 4. This means that the 3×3 structure formed on the surface is removed by the supplied oxygen gas. In FIG. 4, a broken curve indicates a region that only the sub-spots are observed in FIG. 2.

Figure 5:
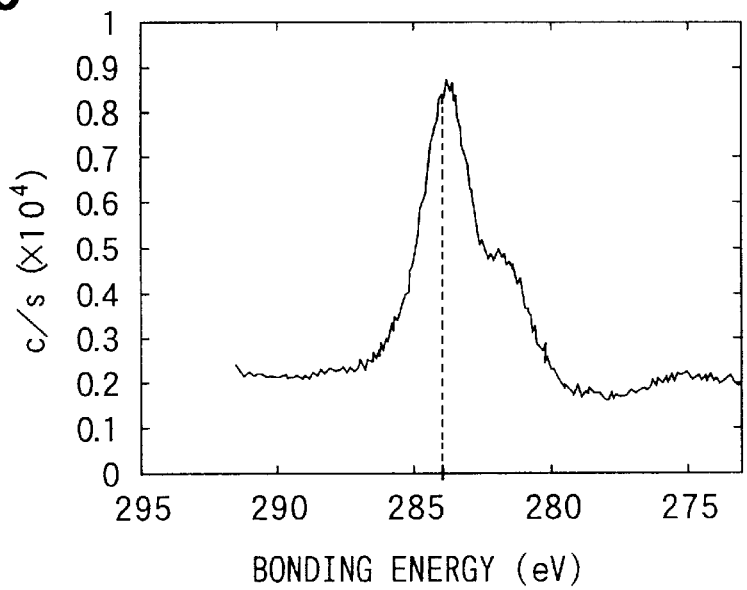
FIG. 5 is a graph showing an XPS spectrum of a cleaned surface of the SiC substrate according to the first embodiment.
Figure 6:
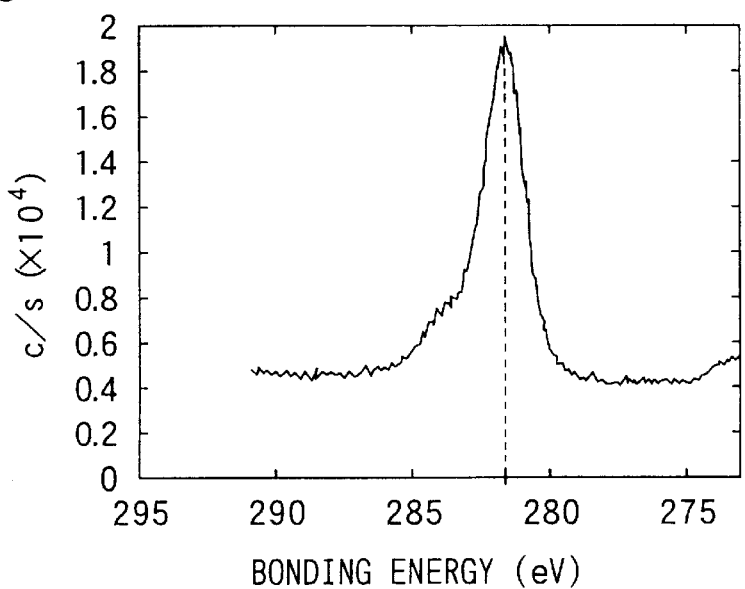
FIG. 6 is a graph showing an XPS spectrum of a surface of the SiC substrate, which is exposed to atmospheric air after cleaned by buffered hydrofluoric acid process.

The surface cleaned in the first example is analyzed using XPS, and the analyzed result is shown in FIG. 5. For comparison, an XPS spectrum of the surface, exposed to atmospheric air after buffered hydrofluoric acid process, is shown in FIG. 6. A spectrum peak of C—C bonding at about 281 eV, presumably due to carbon (C) in atmospheric air, is observed in the spectrum shown in FIG. 6. In the spectrum shown in FIG. 5, however, the spectrum peak of C—C bonding is not substantially observed, but only a spectrum peak of Si-C bonding at about 284 eV is observed.

Accordingly, the cleaned surface of the SiC substrate 1, not contaminated by carbon and the like in atmospheric air, can be obtained as follows. That is, Si atoms on the SiC substrate 1 are made to be reacted with oxygen molecules and oxygen atoms in a high temperature and low pressure condition, so that the Si atoms can be removed from the surface of the SiC substrate without forming an oxide film on the surface.

(Second Embodiment)

Figure 7:
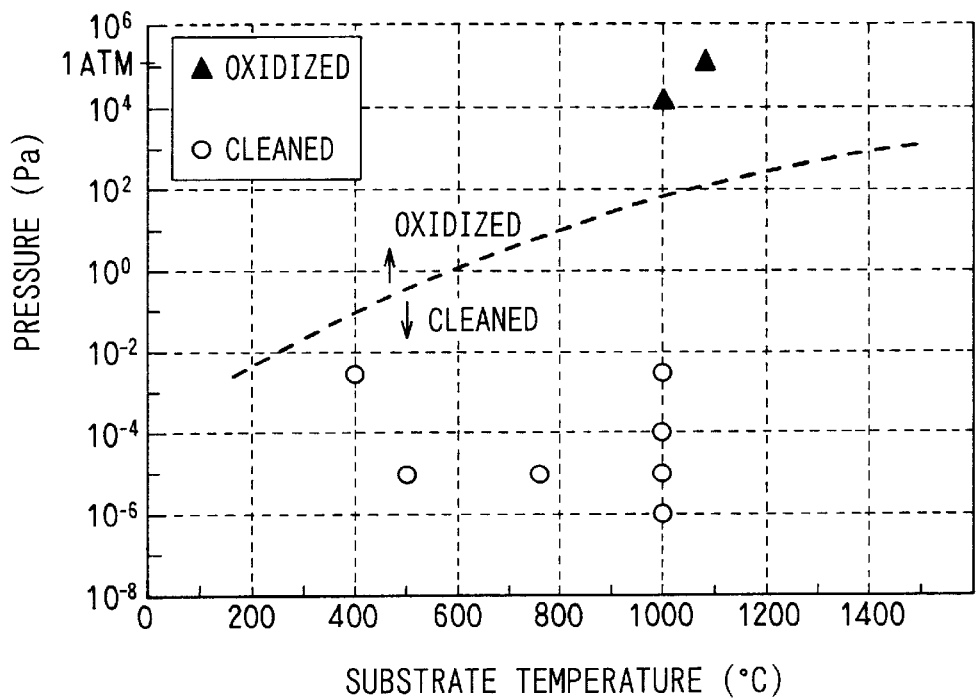
FIG. 7 is a graph showing a condition (surface cleaning condition or surface oxidation condition) on the SiC substrate according to an oxygen pressure and a temperature of the SiC substrate.

As shown in FIG. 7, furthermore, when oxygen gas is supplied into the ultra high vacuum chamber in an ambient temperature of 400° C. to 1000° C. and an ambient pressure of $1\times10^{2}$ to $1\times10^{-6}$ Pa, the cleaned surface (1×1 structure) is found to have been formed on the surface of the SiC substrate 1. On the other hand, the oxide film is found to have been formed on the surface in an ambient temperature of 1000° C. and an ambient pressure of $1\times10^{-4}$ Pa.

It is found that the cleaned surface or the oxide film is formed on the surface according to the ambient temperature and pressure at the time of supplying the oxygen gas.

Therefore, the cleaned surface formation and the oxide film formation on the SiC substrate 1 can be made continuously in the ultra high vacuum chamber by adjusting the ambient temperature and pressure at the time of supplying the oxygen gas.

After the cleaned surface is formed, it is preferable to adjust the ambient pressure to form a silicon oxide layer, while maintaining the temperature unchanged in the chamber.

Figure 8:
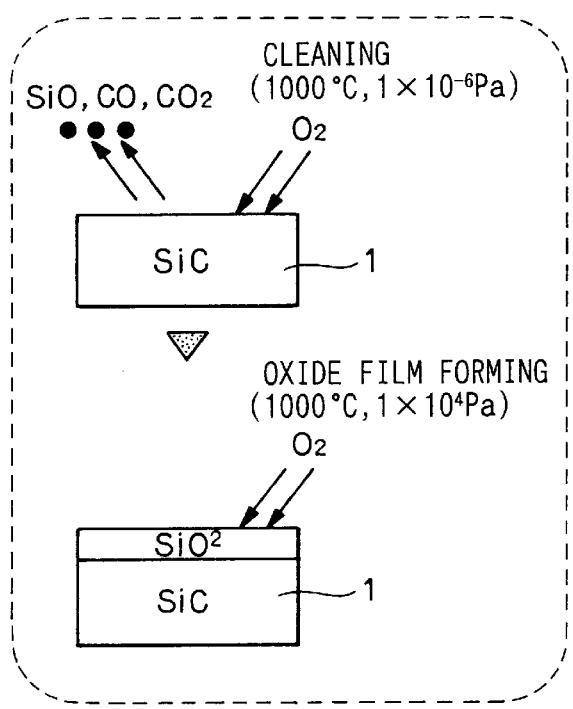
FIG. 8 is a schematic view showing cleaned surface forming process and oxide film forming process according to a second embodiment of the present invention.

For example, the SiC substrate 1 is set up in the ultra high vacuum chamber, and thereafter the oxygen gas is supplied into the ultra high vacuum chamber in an ambient temperature of 1000° C. and an ambient pressure of $10^{-6}$ Pa, so that the cleaned surface (1×1 structure) is formed on the surface of the SiC substrate 1 as shown in FIG. 8. Thereafter, the oxygen gas is further supplied into the ultra high vacuum chamber so that the ambient pressure is increased to $10^{4}$ Pa in the ambient temperature 1000° C., so that the oxide film can be formed on the surface of the SiC substrate 1.

When the above method is used, the cleaning process and the oxide film forming process can be made continuously in the ultra high vacuum chamber only by changing the ambient pressure. Since the oxide film can be formed continuously without taking out SiC substrate 1 from the ultra high vacuum chamber after the cleaning process, all impurities such as carbon can be removed from the surface of the SiC substrate 1 before the oxide film forming process. That is, this method is suitable for a method of forming a boundary between an oxide film and a SiC substrate, which has no impurity.

Even if there are not impurities on the surface of the SiC substrate 1 before the oxide film is formed, it is likely that impurities such as carbon are formed on the surface at the time of forming the oxide film thereafter. In order to solve this problem, it is preferable that carbon atoms and dangling bonds of carbon atoms are removed by making hydrogen process in the course of or after forming the oxide film.

Further, Si atoms and carbon atoms are considered to be terminators on the surface of the 1×1 structure formed using this method. When carbon atoms are terminators on the surface of the 1×1 structure, it is preferable that the outermost surface is made to be a SiC atom layer. In this case, the surface of the 1×1 structure is hydrogen-processed before the oxide film forming process, so that a carbon atom layer is removed.

(Other Embodiments)

Although the Si layer 2 is formed by vapor deposition in the first embodiment, it can be formed by another method. Further, although the Si layer 2 is formed and removed in the ultra high vacuum chamber in the first embodiment, the same process can be made in another apparatus.

The oxygen gas supplied into the ultra high vacuum chamber can be radical oxygen gas. Further, it is not required to be oxygen gas of 100%, but can include another gas such as rare gas. That is, the supply gas is allowed to be gas which does not form a deposition layer on the surface of the SiC substrate 1 at high temperature in the ultra high vacuum chamber.

The surface of the SiC substrate 1 can be a carbon-terminated surface. Further, the Si layer, remaining on the surface of the SiC substrate 1 after a most part of the Si layer 2 is vaporized, can have other periodic structure such as $3^{1/2} \times 3^{1/2}$ structure and 6×6 structure other than 3×3 structure. A method of forming such periodic structures can be a method in which the SiC substrate is heated while providing Si-rich ambient condition around the surface of the SiC with Si flux other than the method in which the Si layer formed on the SiC substrate is vaporized.

The surface of the Si layer, in which such periodic structure is not formed before the surface is exposed to oxygen gas, can be directly exposed to oxygen gas.

Further, the surface of the SiC substrate, on which the Si layer is not formed, can be exposed to oxygen gas. It is however preferable that the Si layer is formed on the surface in view of a vapor pressure of Si.

While the present invention has been described with reference to the preferred embodiments, it will be apparent to those skilled in the art that changes in form and detail may be made therein without departing from the scope of the invention.

What is claimed is:

1. A process of producing a silicon carbide device, wherein a surface of a silicon carbide substrate is cleaned and a silicon carbide device is produced using the cleaned surface, the process of producing a silicon carbide device comprising steps of:
    forming a silicon layer on a surface of a silicon carbide substrate; and
    removing the silicon layer from the surface of the silicon carbide substrate by supplying oxygen gas to the silicon layer in a predetermined ambient temperature and pressure set at $1 \times 10^{-2}$ to $1 \times 10^{-6}$ Pa, wherein the ambient temperature at the time of supplying the oxygen gas is set at approximately 500 to 1100° C.

2. The process of producing a silicon carbide device according to claim 1, wherein the silicon layer has a periodic structure.

3. The process of producing a silicon carbide device according to claim 2, wherein the silicon layer has a 3×3 surface structure.

4. The process of producing a silicon carbide device according to claim 1, wherein the ambient temperature at the time of supplying the oxygen gas is set at about 1000° C.

5. The process of producing a silicon carbide device according to claim 1, wherein a supply amount of the oxygen gas is adjusted so that an oxygen exposure amount onto the surface of the silicon carbide substrate is set at 1 to $10^2$ Pa·sec.

6. The process of producing a silicon carbide device according to claim 5, wherein the oxygen exposure amount is set at about 10 Pa·sec.

7. The process of producing a silicon carbide device according to claim 1, wherein the ambient pressure at the time of supplying the oxygen gas is set at about $1 \times 10^{-2}$ Pa.

8. The process of producing a silicon carbide device according to claim 1, wherein the surface of the silicon carbide substrate has a silicon-terminated surface.

9. The process of producing a silicon carbide device according to claim 1, wherein the surface of the silicon substrate has no off angle.

10. A method of cleaning a surface of a silicon carbide substrate comprising a step of:
    removing a surface layer, formed on a surface of a silicon carbide substrate, by supplying oxygen gas onto the surface layer in a predetermined ambient pressure of approximately $1 \times 10^{-2}$ to $1 \times 10^{-6}$ Pa and a predetermined ambient temperature of approximately 400 to 1000° C.

11. The method of cleaning a surface of a silicon carbide substrate according to claim 10, further comprising a step of:
    forming a silicon layer on the surface of the silicon carbide substrate before supplying the oxygen gas onto the surface thereof.

12. The method of cleaning a surface of a silicon carbide substrate according to claim 11, further comprising a step of:
    partially vaporizing the silicon layer formed on the surface of the silicon carbide substrate before supplying the oxygen gas onto the surface thereof.

13. A process of producing a silicon carbide device comprising steps of:
    placing a silicon carbide substrate in a chamber;
    supplying oxygen gas in the chamber in a predetermined ambient temperature and pressure to clean a surface of the silicon carbide substrate; and
    adjusting at least the predetermined ambient pressure in the chamber while continuing to supply oxygen gas to form a silicon oxide layer on a cleaned surface of the silicon carbide substrate.

14. The process of producing a silicon carbide device according to claim 13, further comprising a step of:
    forming a silicon layer on the surface of the silicon carbide substrate before the oxygen supplying step,
    wherein the silicon layer and the cleaned surface of the silicon carbide substrate have periodic structures.

15. The process of producing a silicon carbide device according to claim 13, wherein the periodic structure of the silicon layer on the silicon carbide substrate is the 3×3 structure, and the periodic structure of the cleaned surface of the silicon carbide is the 1×1 structure.

16. The process of producing a silicon carbide device according to claim 13, wherein the ambient temperature is set at 400 to 1000° C. and the ambient pressure is set at $1 \times 10^{-2}$ to $1 \times 10^{-6}$ Pa in the oxygen supplying step.

17. The process of producing a silicon carbide device according to claim 13, wherein the adjusting step raises the ambient pressure to about $1 \times 10^4$ Pa while maintaining the ambient temperature at about 1000° C.

18. The process of producing a silicon carbide device according to claim 13, wherein the adjusting step adjusts both the ambient pressure and temperature.

19. The process of producing a silicon carbide device according to claim 13, wherein the adjusting step adjusts only the ambient pressure, while maintaining the temperature unchanged.

20. A process of producing a silicon carbide device, wherein a surface of a silicon carbide substrate is cleaned and a silicon carbide device is produced using the cleaned surface, the process of producing a silicon carbide device comprising steps of:

forming a silicon layer on a surface of a silicon carbide substrate; and removing the silicon layer from the surface of the silicon carbide substrate by supplying oxygen gas to the silicon layer in a predetermined ambient temperature and pressure set at $1\times10^{-2}$ to $1\times10^{6}$ Pa, wherein a supply amount of the oxygen gas is adjusted so that an oxygen exposure amount onto the surface of the silicon carbide substrate is approximately 1 to $10^{2}$ Pa sec.

21. A process of producing a silicon carbide device, wherein a surface of a silicon carbide substrate is cleaned and a silicon carbide device is produced using the cleaned surface, the process of producing a silicon carbide device comprising steps of:

forming a silicon layer on a surface of a silicon carbide substrate; and removing the silicon layer from the surface of the silicon carbide substrate by supplying oxygen gas to the silicon layer in a predetermined ambient temperature and pressure set at $1\times10^{-2}$ to $1\times10^{-6}$ Pa, wherein the ambient pressure at the time of supplying the oxygen gas is set to about $1\times10^{-2}$ Pa.

22. A process of producing a silicon carbide device, wherein a surface of a silicon carbide substrate is cleaned and a silicon carbide device is produced using the cleaned surface, the process of producing a silicon carbide device comprising steps of:

forming a silicon layer on a surface of a silicon carbide substrate; and removing the silicon layer from the surface of the silicon carbide substrate by supplying oxygen gas to the silicon layer in a predetermined ambient temperature and pressure set at $1\times10^{-2}$ to $1\times10^{-6}$ Pa, wherein the surface of the silicon carbide substrate has a silicon-terminated surface.

23. A method of cleaning a surface of a silicon carbide substrate comprising steps of:

removing a surface layer, formed on a surface of a silicon carbide substrate, by supplying oxygen gas onto the surface layer in a predetermined ambient pressure of approximately $1\times10^{-2}$ to $1\times10^{-6}$ Pa; and forming a silicon layer on the surface of the silicon carbide substrate before supplying the oxygen gas onto the surface layer.

* * * * *